United States Patent
Moriya

(10) Patent No.: US 7,573,341 B2
(45) Date of Patent: Aug. 11, 2009

(54) SURFACE MOUNT TYPE CRYSTAL OSCILLATOR

(75) Inventor: Kouichi Moriya, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/540,592

(22) Filed: Oct. 2, 2006

(65) Prior Publication Data
US 2007/0075795 A1    Apr. 5, 2007

(30) Foreign Application Priority Data
Sep. 30, 2005    (JP)    ............................. 2005-288298

(51) Int. Cl.
*H03B 1/00*    (2006.01)
(52) U.S. Cl. ........................... 331/68; 331/158; 310/348
(58) Field of Classification Search ............. 331/116 R, 331/116 FE, 108 C, 108 D, 158; 310/311, 310/346, 348, 349, 351, 365, 366
See application file for complete search history.

(56) References Cited
U.S. PATENT DOCUMENTS
2003/0058056 A1 *    3/2003    Moriya et al. ............... 331/158
2006/0055478 A1 *    3/2006    Isimaru ...................... 331/158
2006/0267451 A1 *    11/2006    Horie et al. ................. 310/311

FOREIGN PATENT DOCUMENTS
JP    2001-094378 A    4/2001

* cited by examiner

*Primary Examiner*—Robert Pascal
*Assistant Examiner*—Ryan J. Johnson
(74) *Attorney, Agent, or Firm*—Fitch, Even, Tabin & Flannery

(57)    ABSTRACT

A surface mount type crystal oscillator is provided with a crystal blank, an IC chip which incorporates an oscillation circuit using the crystal blank, a substantially rectangular parallelepiped container body for surface mounting which houses the crystal blank and the IC chip, and mounting electrodes provided in four corners of an outer bottom surface of the container body. Each of the mounting electrodes is provided so as to extend over a side surface of the container body as an end face electrode. At least one adjustment terminal is disposed above the end face electrode on the side surface of the container body electrically isolated from the end face electrode. The adjustment terminal is longer along the height direction of the container body than the end face electrode.

7 Claims, 3 Drawing Sheets

SURFACE MOUNT TYPE CRYSTAL OSCILLATOR

This Application is a U.S. Utility Patent Application which claims foreign priority from Japanese Patent Application No. 2005-288298, filed Sep. 30, 2005, the complete disclosure of which is incorporated herein by reference.

BACKGROUND OF THE INVENTION

1. Field of the Invention

The present invention relates to a surface mount type crystal oscillator provided with adjustment terminals on an outer surface of a container, and more particularly, to a surface mount type crystal oscillator meeting downsizing requirements.

2. Description of the Related Arts

For its small size and lightweight, a surface mount type crystal oscillator which houses a quartz crystal unit and an oscillation circuit using this crystal unit in a surface mount type container is incorporated, for example, in a portable electronic apparatus as a reference source for a frequency and time. One of such surface mount type crystal oscillators is provided with, on an outer surface of the container, adjustment terminals including a writing terminal to write temperature compensation data into the crystal oscillator and an inspection terminal used to inspect characteristics of the crystal unit. However, a crystal oscillator has been increasingly downsized in recent years and it is becoming increasingly difficult to provide these adjustment terminals on the outside surface of the container of the surface mount type crystal oscillator.

FIG. 1A is a sectional view showing an example of the configuration of a conventional surface mount type crystal oscillator, FIG. 1B is a front view of the crystal oscillator and FIG. 1C is a bottom view of the crystal oscillator. FIG. 1A shows a section of FIG. 1C along line A-A.

The illustrated surface mount type crystal oscillator is provided with container body 1 which is made of laminated ceramic and has a recess, IC (Integrated Circuit) chip 2 housed in the recess of container body 1, and quartz crystal blank 3. A metal ring made of a metal thick film is provided on the periphery of the opening of the recess of container body 1. IC chip 2 and crystal blank 3 are hermetically sealed in the recess by covering and closing the recess with metal cover 4 by seam-welding metal cover 4 with the metal ring. The crystal unit is configured especially by hermetically sealing crystal blank 3 in container body 1.

Container body 1 has a flat, substantially rectangular parallelepiped outside shape having short sides and long sides when mounted on a wiring board and viewed from above, and a step portion is formed in an inner wall of container body 1. Mounting electrodes 5 are formed in the four corners of the outer bottom face of container body 1 to surface-mount this crystal oscillator on the wiring board. Each mounting electrode 5 is formed so as to extend not only over the outer bottom surface but also from the outer bottom surface over the side surface along the long side of container body 1. A portion of mounting electrode 5 formed over the side surface of container body 1 is called "end face electrode 5a."

In the illustrated crystal oscillator, the laminated ceramic which makes up container body 1 has a four-layer structure of first layer A, second layer B, third layer C and fourth layer D in that order from the bottom surface side. End face electrodes 5a are formed on the end faces of first layer A to third layer C but are not provided at positions corresponding to the end faces of fourth layer D.

Furthermore, writing terminals 6a for writing temperature compensation data and characteristic inspection terminals 6b used for a characteristic inspection of the crystal unit are provided on the outer side surface of container body 1 as adjustment terminals. Two writing terminals 6a are provided on each side surface along the long side of container body 1. At this time, end face electrodes 5a are formed on the side surfaces along the long sides of container body 1 at both ends thereof as described above and writing terminals 6a are interposed between these end face electrodes 5a. Furthermore, each of characteristic inspection terminals 6b is provided substantially at the center of each side surface along the short side of container body 1. These writing terminals 6a and characteristic inspection terminals 6b are formed on the end faces of second layer B and third layer C out of the four layers of the laminate ceramic and not formed on the end faces of first layer A and fourth layer D.

It should be noted that the reason that end face electrodes 5a and adjustment terminals 6a, 6b are not formed on the end faces of fourth layer D is to prevent electric short circuits between these electrodes, terminals and metal ring. Furthermore, the reason that adjustment terminals 6a, 6b are not formed on the end faces of first layer A either is to prevent electric short circuits between the adjustment terminals and wiring board when the crystal oscillator is mounted on the wiring board.

The method of forming such end face electrodes 5a and adjustment terminals (i.e., writing terminals 6a and characteristic inspection terminals 6b) will be explained. When forming the container body for surface mounting made of laminated ceramic, it is a general practice to use ceramic green sheets each having a size corresponding to a plurality of container bodies, laminate and burn the sheets, and then divide the burned sheets into individual container bodies. Therefore, a ceramic sheet in a size corresponding to a plurality of container bodies 1 is also used here as the ceramic sheet of each layer. When container body 1 is formed of laminated ceramic, end face electrodes 5a and adjustment terminals 6a, 6b are formed by so-called through-hole work after forming an electrode pattern of W (tungsten) or the like in the ceramic sheet of each layer by printing and uniting the ceramic sheets of the respective layers. In the illustrated example, second layer B and third layer C are united first, adjustment terminals 6a, 6b are formed by through-hole work, and then first layer A is united and end face electrodes 5a are formed by through-hole work. Fourth layer D is united and then all these layers are burned, and after forming, for example, gold plating on the electrode pattern, the united ceramic sheet is then divided into individual container bodies 1. Container body 1 provided with end face electrodes and adjustment terminals is formed in this way. When through-hole work is performed, through holes are also provided in first layer A and fourth layer D to make through-hole surfaces thereon even when no electrode pattern is formed on first layer A and fourth layer D.

IC chip 2 has a substantially rectangular shape and is configured to integrate an oscillation circuit using crystal blank 3 and a temperature compensation mechanism for compensating the frequency temperature characteristic of crystal blank 3 in a semiconductor substrate. The oscillation circuit and temperature compensation mechanism are formed on one main surface of the semiconductor substrate through a normal semiconductor device fabricating process. Therefore, suppose the surface of the semiconductor substrate on which the oscillation circuit and temperature compensation mechanism are formed out of both main surfaces of IC chip 2 is called a "circuit forming surface." A plurality of terminals for connecting IC chip 2 to an external circuit are also formed on the circuit forming surface. These terminals include a power supply terminal, a grounding terminal, an oscillation output terminal, a pair of connection terminals for connection with the crystal blank, an AFC (automatic frequency control) terminal to which an AFC signal is supplied and input terminals for writing data into the temperature compensation mechanism or the like.

A circuit pattern (not shown) made up of circuit terminals and conductive paths corresponding to the terminals on the IC chip 2 side is formed on the bottom surface of the recess of container body 1. By joining the terminals of IC chip 2 and circuit terminals on the bottom surface of the recess through ultrasonic thermal compression bonding using, for example, bumps 7, IC chip 2 is secured to the bottom surface of the recess of container body 1 with the circuit forming surface facing the bottom surface of the recess. The power supply terminal, grounding terminal, output terminal and AFC terminal out of the terminals of IC chip 2 are connected to corresponding end face electrodes 5a through conductive paths formed on the lamination surface of the laminated ceramic and thereby connected to mounting electrodes 5, too. Furthermore, a pair of connection terminals for connection with crystal blank 3 are also connected to characteristic inspection terminals 6b through similar conductive paths and the input terminals are also connected to writing terminals 6a.

Crystal blank 3 is, for example, a substantially rectangular AT-cut quartz crystal blank provided with excitation electrodes (not shown) on both main surfaces thereof and extending electrodes extend from these excitation electrodes toward both sides of one end of crystal blank 3, respectively. Crystal blank 3 is held level in the recess as illustrated by fixing the extending electrodes to the top face of the step portion in the recess of container body 1 using conductive adhesive 8. Conductive paths (not shown) are also formed in the step portion of the recess, and crystal blank 3 is electrically connected to the connection terminals of IC chip 2 through the conductive paths and thereby electrically inserted into an oscillation closed loop of the oscillation circuit in IC chip 2. Since the connection terminals of IC chip 2 are also connected to characteristic inspection terminals 6b as described above, crystal blank 3 is connected parallel to the oscillation circuit and the pair of characteristic inspection terminals 6b.

With such a crystal oscillator, it is possible to operate the oscillation circuit, measure an oscillating frequency and adjust the oscillating frequency using mass load on crystal blank 3 by causing a probe of a measuring instrument to contact end face electrodes 5a in a condition in which IC chip 2 and crystal blank 3 are provided whereas no metal cover 4 is provided. Furthermore, after sealing IC chip 2 and crystal blank 3 in the recess with metal cover 4, it is possible to cause the probe to contact writing terminal 6a and write temperature compensation data into the temperature compensation mechanism in IC chip 2. Furthermore, by causing the probe to contact characteristic inspection terminal 6b, it is possible to measure the vibration characteristic of crystal blank 3 as a crystal unit alone. In this way, since end face electrodes 5a, writing terminals 6a, characteristic inspection terminals 6b are exposed on the side surfaces of container body 1, it is possible to perform various inspections and adjustment work by causing the probe to contact the electrodes and terminals from the lateral directions without mounting the crystal oscillator on the wiring board. In the case of a crystal oscillator requiring no temperature compensation data to be written, writing terminals 6a out of the adjustment terminals need not be provided.

As for devices for surface mounting, mounting electrodes formed on the bottom surface of the container body are also extended to a certain degree over the side surfaces of container body 1 to form end face electrodes and solder fillet is thereby formed on each of the side surfaces when the device is mounted on the wiring board. Since the quality of soldering can be accurately judged according to the presence/absence of the solder fillet, it is general to provide end face electrodes in a surface mount type device. The above described crystal oscillator is designed such that the probe can contact the end face electrode by forming such a large end face electrode.

As for the above described crystal oscillator, through-hole work is used for the laminated ceramic when forming end face electrodes 5a and adjustment terminals 6a, 6b, and therefore end face electrodes 5a and adjustment terminals 6a, 6b are formed into a concave shape, which makes contact by the probe easier.

However, due to further downsizing of the surface mount type crystal oscillator in the above described structure, when the planar outside size thereof is, for example, 2.5×2.0 mm or smaller, adjustment terminals 6a, 6b come to contact end face electrodes 5a, and therefore it is difficult to provide such adjustment terminals. Especially when writing terminals 6a are provided for a temperature compensation type crystal oscillator, the number of adjustment terminals increases together with characteristic inspection terminals 6b for the crystal unit, and so the problem becomes more serious in particular. Writing terminals 6a and characteristic inspection terminals 6b need to be as large as 0.4×0.4 mm or more to keep contact with the probe of the measuring instrument.

SUMMARY OF THE INVENTION

It is an object of the present invention to provide a surface mount type crystal oscillator which allows adjustment terminals to be easily provided through effective utilization of an outside surface of a container body.

The object of the present invention can be attained by a surface mount type crystal oscillator including a crystal blank, an IC chip which incorporates an oscillation circuit using the crystal blank, a substantially rectangular parallelepiped container body for surface mounting which houses the crystal blank and the IC chip, and mounting electrodes provided in four corners of an outer bottom surface of the container body, wherein each of the mounting electrodes is provided so as to extend over a side surface of the container body as an end face electrode, at least one adjustment terminal is disposed above the end face electrode on the side surface of the container body electrically isolated from the end face electrode and the adjustment terminal is longer along the height direction of the container body than the end face electrode.

The crystal oscillator of the present invention arranges the adjustment terminals and end face electrodes on a side surface of the substantially rectangular parallelepiped container in a height direction of the container so as to be electrically isolated from each other in the four corner portions of the container body, and therefore it is possible to effectively use the outer side surface of the container body at positions of the four corners of the container body and secure a sufficient area with which an adjustment probe comes into contact. Furthermore, the adjustment terminals are longer than the end face electrodes, and therefore the probe can be made to reliably contact the adjustment terminals. In this way, even when the downsizing of the surface mount type crystal oscillator advances, the present invention allows the adjustment terminals to be easily provided.

DETAILED DESCRIPTION OF PREFERRED EMBODIMENTS

Figure 1A:
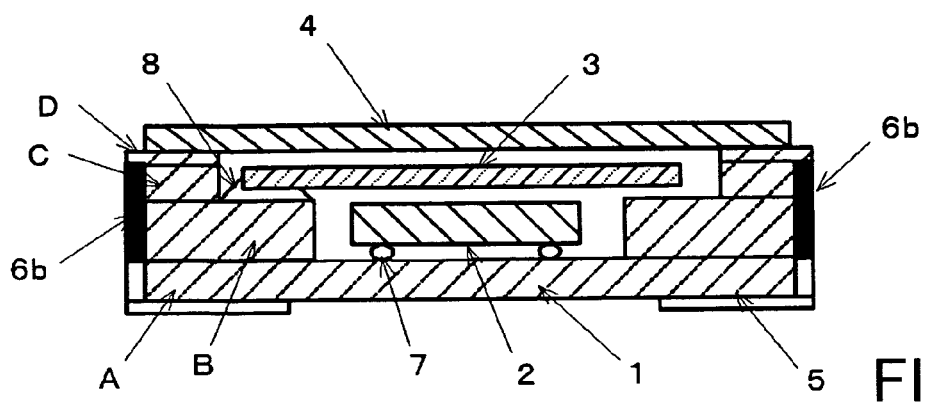
FIG. 1A is a sectional view showing an example of the structure of a conventional surface mount type crystal oscillator.
Figure 1B:
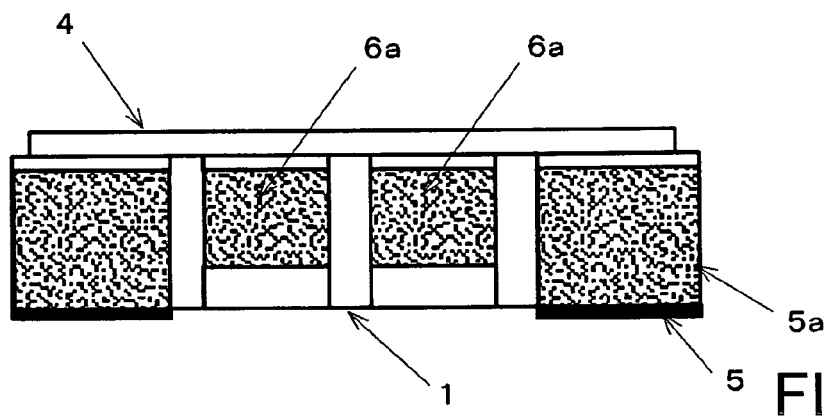
FIG. 1B is a front view of the surface mount type crystal oscillator shown in FIG. 1A.
Figure 1C:
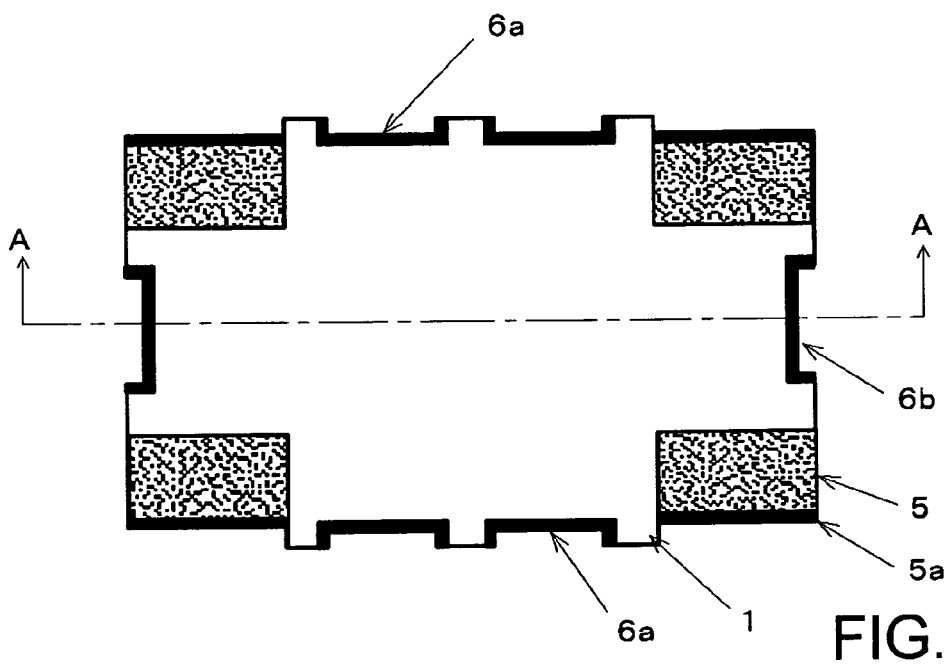
FIG. 1C is a bottom view of the surface mount type crystal oscillator shown in FIG. 1A.
Figure 2A:
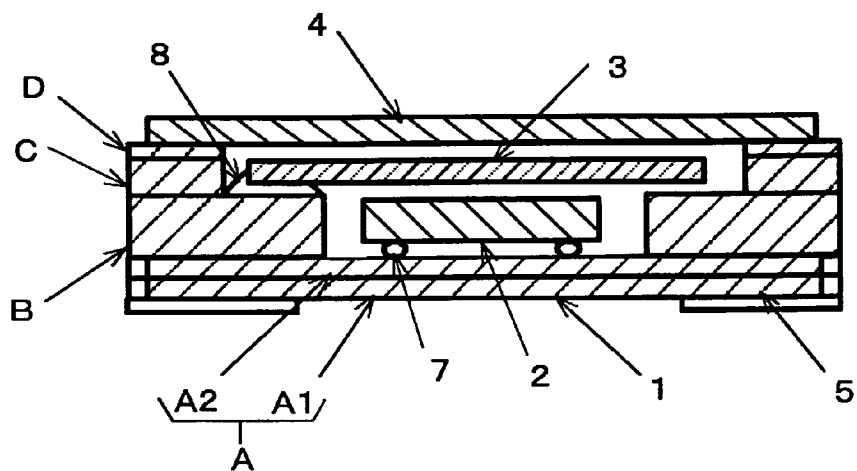
FIG. 2A is a sectional view showing the structure of a surface mount type crystal oscillator according to an embodiment of the present invention.
Figure 2B:
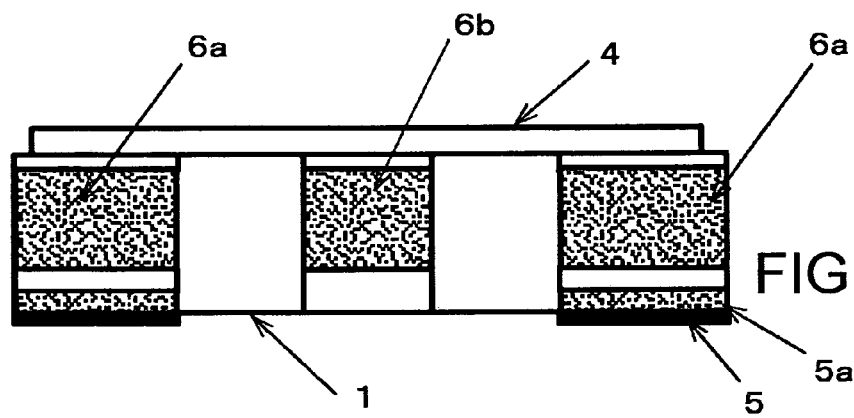
FIG. 2B is a front view of the surface mount type crystal oscillator shown in FIG. 2A.
Figure 2C:
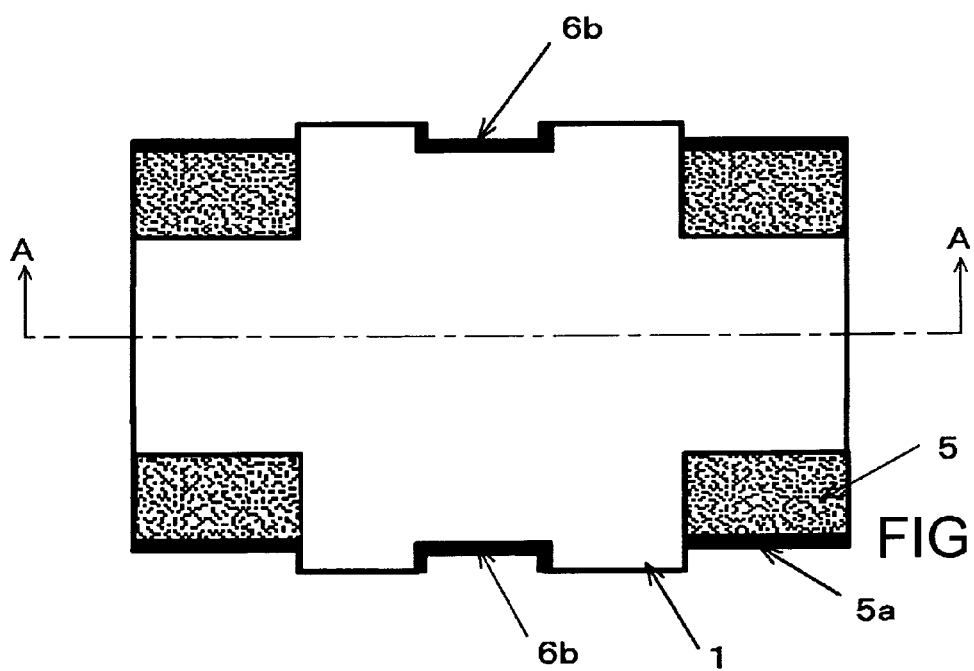
FIG. 2C is a bottom view of the surface mount type crystal oscillator shown in FIG. 2A.

FIG. 2A to FIG. 2C show a surface mount type crystal oscillator according to a first embodiment of the present invention. FIG. 2A shows a section along line A-A of FIG. 2C. In FIG. 2A to FIG. 2C, the same components as those in FIG. 1A to FIG. 1C are assigned the same reference numerals.

As with the conventional crystal oscillator described above, the surface mount type crystal oscillator according to the present embodiment is provided with substantially rectangular parallelepiped container body 1 made of laminated ceramic and having a recess, IC chip 2 firmly fixed to a bottom surface of the recess of container body 1, crystal blank 3 held in the recess and metal cover 4 which hermetically seals IC chip 2 and crystal blank 3 in the recess. IC chip 2 and crystal blank 3 used are identical to those used for the above described conventional crystal oscillator. A step portion is formed in the recess of container body 1, and crystal blank 3 is held in the recess such that both sides of one end of crystal blank 3 to which extending electrodes are extended are adhered to a top face of the step portion by conductive adhesive 8.

In the crystal oscillator according to the present embodiment, mounting electrodes are also provided in the four corners of the outer bottom surface of container body 1 respectively and writing terminals 6a for writing temperature compensation data and characteristic inspection terminals 6b used for inspecting the characteristic of the crystal unit are provided on the outer side surface of container body 1. However, unlike the conventional crystal oscillator shown in FIG. 1A to FIG. 1C, the crystal oscillator of the present embodiment has smaller end face electrodes 5a which are formed by causing mounting electrode 5 to extend over the outer side surface of container body 1 and writing terminals 6a formed so that end face electrodes 5a and writing terminal 6a are aligned in the height direction of container body 1. In other words, on the side surfaces along the long sides of the four side surfaces of container body 1, that is, on a pair of side surfaces having a wider width and at both ends of the side surface, end face electrodes 5a are formed below and writing electrodes 6a are formed above electrically isolated from end face electrodes 5a. Writing terminals 6a are electrically connected with input terminals of IC chip 2. Characteristic inspection terminals 6b are formed in a substantially central area of the side surfaces along the long sides instead of the side surfaces along the short sides of container body 1. Characteristic inspection terminals 6b are electrically connected to connection terminals of IC chip 2.

In order to form end face electrodes 5a, writing terminals 6a and characteristic inspection terminals 6b in this way, container body 1 is formed of laminated ceramic of a 5-layer structure. In this crystal oscillator, first layer A in the conventional crystal oscillator shown in FIG. 1A is divided into lowest layer A1 on the bottom-most side and layer A2 which is interposed between layer A1 and second layer B. End face electrodes 5a are formed only on the end faces in the corner portions of lowest layer A1 while none of the end face electrodes, writing terminals or the characteristic inspection terminals is disposed on layer A2. However, as in the case of the above described conventional crystal oscillator, layer A2 itself is worked into a through-hole surface. As described above, end face electrodes 5a are electrically connected to power supply, output, grounding and AFC terminals of IC chip 2 by means of through holes (not shown) formed in lowest layer A1 and conductive paths formed in the lamination surface or the like, and mounting electrodes 5 are also electrically connected to the power supply, output, grounding and AFC terminals of IC chip 2. Writing terminals 6a and characteristic inspection terminals 6b as adjustment terminals 6 are provided on the end faces of second layer B and third layer C. At this time, writing terminals 6a are made to be longer than end face electrodes 5a. Here, the "length" means length in a height direction of the container body. Fourth layer D is subjected to through-hole work, but none of writing terminals 6a and characteristic inspection terminals 6b is formed on the end faces thereof.

In this crystal oscillator, since writing terminals 6a and end face electrodes 5a are arranged spaced apart in the vertical direction along the both edges of each side surface which is along the long side of container body 1, it is possible to effectively use the outer side surface in the four corner portions of the container body and thereby dispose characteristic inspection terminals 6b in the central portions of the side surfaces with sufficient space. Making writing terminals 6a longer than end face electrodes 5a allows the probe to reliably contact writing terminals 6a.

When measuring or adjusting an oscillating frequency, the crystal oscillator is made to perform oscillation operation by causing the probe to contact the outer bottom surface of container body 1. When writing temperature compensation data, the probe is made to contact writing terminals 6a and when measuring a vibration characteristic of the crystal unit, the probe is made to contact characteristic inspection terminals 6b.

When the crystal oscillator is mounted on the wiring board, solder fillet is formed on each of end face electrodes 5a as in the case of the conventional surface mount type device, and therefore it is possible to judge the quality of soldering accurately.

Figure 3A:
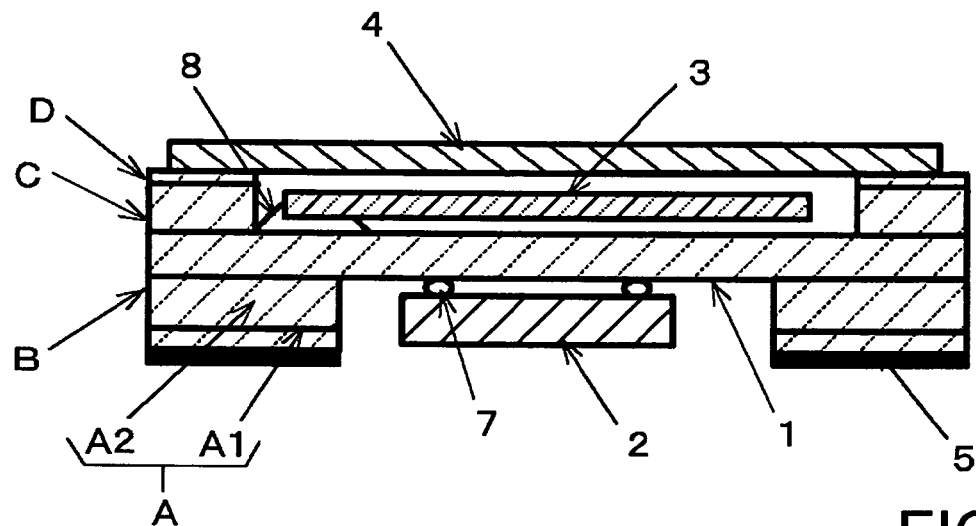
FIG. 3A is a sectional view showing the structure of a surface mount type crystal oscillator according to another embodiment of the present invention.
Figure 3B:
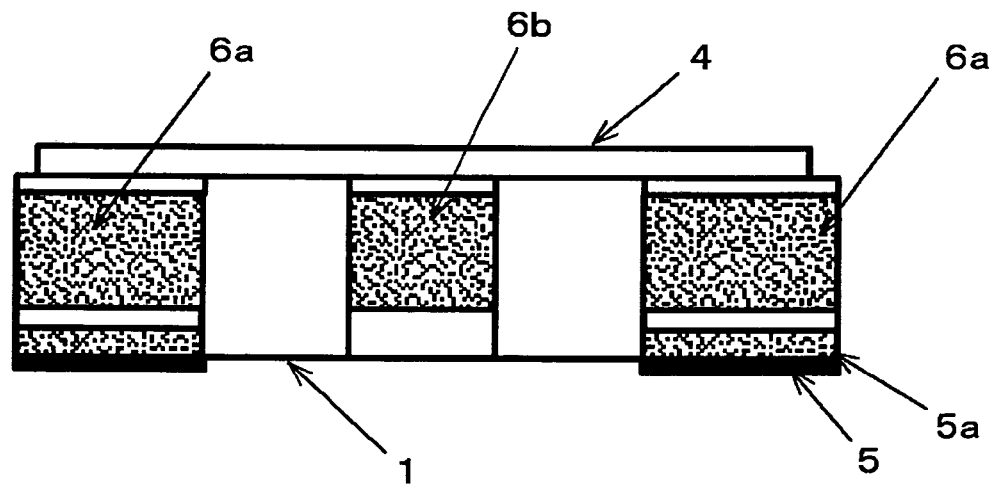
FIG. 3B is a front view of the surface mount type crystal oscillator shown in FIG. 3A.

The above described crystal oscillator has a configuration with a crystal blank and an IC chip hermetically sealed in the same recess of container body 1, but the surface mount type crystal oscillator to which the present invention is applied to is not limited to the above described configuration. FIG. 3A and FIG. 3B show a different crystal oscillator to which the present invention is applied.

The crystal oscillator shown in FIG. 3A and FIG. 3B has a recess in each of both main surfaces of flat-shaped container body so that the sectional shape of the container body is H-figured. IC chip 2 is housed in one of the recesses and mounting electrodes 5 are formed in the four corners of an open face of the recess. Crystal blank 3 is housed in the other recess and crystal blank 3 is hermetically sealed in the other recess with metal cover 4. End face electrodes 5*a* are formed on the side surfaces of container body 1 extending from mounting electrodes 5 and writing terminals 6*a* are provided above end face electrodes 5*a* as illustrated while being electrically isolated from end face electrodes 5*a* in this case, too. In this case, one of the recesses in which IC chip 2 is housed may have open frame walls and may be provided with only legs corresponding to the four corners.

In the above described crystal oscillators, writing terminals 6*a* are provided in all the four corners of container body 1 so as to align with end face electrodes 5*a* in the vertical direction, but the present invention is not limited to such a configuration. The advantageous effect of the present invention can also be achieved with a configuration whereby adjustment terminals are provided so as to align with the end face electrodes in the vertical direction in at least one of the four corners of the container body. Characteristic inspection terminals 6*b* are provided in the center of the side surfaces including the long sides of the container body but may also be provided in the center of the side surfaces including the short sides of the container body. Thus, the adjustment terminals including writing terminals and characteristic inspection terminals can be arranged at arbitrary locations of the outer side surface of the container body as required as a matter of course. Moreover, the number of writing terminals is not limited to four but can be, for example, two.

What is claimed is:

1. A surface mount type crystal oscillator comprising:
    a crystal blank;
    an IC chip which incorporates an oscillation circuit using said crystal blank;
    a substantially rectangular parallelepiped container body for surface mounting which houses said crystal blank and said IC chip; and
    mounting electrodes provided in four corners of an outer bottom surface of said container body;
    wherein said container body has an upper top surface and through-holes extending between said bottom surface to said top surface to thereby form through-hole surfaces extending between the bottom surface and the top surface, and
    wherein each of said mounting electrodes is provided so as to extend over a side surface of said container body as an end face electrode, at least one adjustment terminal is disposed above said end face electrode on the side surface of said container body electrically isolated from said end face electrode, and the corresponding adjustment terminal is formed within a contiguous through-hole surface, said adjustment terminal being longer along the height direction of the container body than said end face electrode.

2. The crystal oscillator according to claim 1, wherein said container body comprises a recess provided with a step portion on an inner wall thereof, and said IC chip is secured to an inner bottom surface of said recess and said crystal blank is held in said recess with one end thereof being fixed to said step portion.

3. The crystal oscillator according to claim 1, wherein said container body is provided with recesses on both main surfaces, said IC chip is housed in one recess and said crystal blank is hermetically sealed in the other recess.

4. The crystal oscillator according to claim 1, wherein said adjustment terminal is a writing terminal for writing temperature compensation data.

5. The crystal oscillator according to claim 1, wherein said container body is made of laminated ceramic.

6. The crystal oscillator according to claim 1, wherein a plurality of said adjustment terminals are provided, and said plurality of adjustment terminals includes a writing terminal for writing temperature compensation data and a characteristic inspection terminal used for measuring characteristics of said crystal blank as a crystal.

7. The crystal oscillator according to claim 1, wherein said adjustment terminal is a characteristic inspection terminal used for measuring characteristics of said crystal blank as a crystal unit.

* * * * *